(12) United States Patent
Hunt et al.

(10) Patent No.: US 11,904,805 B2
(45) Date of Patent: Feb. 20, 2024

(54) TAMPER-RESISTANT ACTUATOR FOR A VEHICLE ANTI-THEFT FEATURE

(71) Applicant: GHSP, Inc., Grand Haven, MI (US)

(72) Inventors: Benjamin Cosimo Hunt, Grand Haven, MI (US); John Thomas Bagley, Grand Haven, MI (US)

(73) Assignee: GHSP, Inc., Holland, MI (US)

( * ) Notice: Subject to any disclaimer, the term of this patent is extended or adjusted under 35 U.S.C. 154(b) by 0 days.

(21) Appl. No.: 17/785,475

(22) PCT Filed: Jan. 13, 2021

(86) PCT No.: PCT/IB2021/050215
§ 371 (c)(1),
(2) Date: Jun. 15, 2022

(87) PCT Pub. No.: WO2021/144705
PCT Pub. Date: Jul. 22, 2021

(65) Prior Publication Data
US 2023/0021856 A1    Jan. 26, 2023

Related U.S. Application Data

(60) Provisional application No. 62/960,275, filed on Jan. 13, 2020.

(51) Int. Cl.
*B60R 25/01*     (2013.01)
*H03K 5/125*    (2006.01)
*H03K 17/687*  (2006.01)
*B60R 25/00*     (2013.01)

(52) U.S. Cl.
CPC ............. *B60R 25/01* (2013.01); *H03K 5/125* (2013.01); *H03K 17/687* (2013.01); *B60R 25/002* (2013.01)

(58) Field of Classification Search
None
See application file for complete search history.

(56) References Cited

U.S. PATENT DOCUMENTS

| | | | | |
|---|---|---|---|---|
| 4,977,375 A | * | 12/1990 | Toth | ........................ G01R 19/15 |
| | | | | 324/510 |
| 5,222,468 A | * | 6/1993 | Korenaga | ............. B60R 25/045 |
| | | | | 180/287 |
| 5,894,272 A | | 4/1999 | Brassier et al. | |
| 6,052,646 A | * | 4/2000 | Kirkhart | ................. G01S 19/34 |
| | | | | 701/53 |

FOREIGN PATENT DOCUMENTS

| | | |
|---|---|---|
| DE | 69735366 | 11/2006 |
| DE | 112018000264 | 10/2019 |

* cited by examiner

*Primary Examiner* — Kenneth B Wells
(74) *Attorney, Agent, or Firm* — Price Heneveld LLP

(57) ABSTRACT

A tamper-resistant actuator includes a valid input, configured to deliver an input electrical current through a circuit. A high-pass filter is positioned within the circuit that degrades components of the input electrical current that are outside of a predefined current range. Components that are within the predefined current range define an output current. A transistor activates a switch when the output current from the high-pass filter is received by the transistor.

20 Claims, 6 Drawing Sheets

US 11,904,805 B2

TAMPER-RESISTANT ACTUATOR FOR A VEHICLE ANTI-THEFT FEATURE

FIELD OF THE INVENTION

The present invention generally relates to vehicle actuators, and more specifically, a vehicle actuator having a tamper-resistant portion that can act as an anti-theft feature within a vehicle.

BACKGROUND OF THE INVENTION

Tampering and theft of vehicles is a consistent concern for vehicle manufacturers and vehicle owners. Anti-theft features are incorporated within vehicles that require certain unique identifiers or biometric indicators for allowing access to the vehicle, moving the vehicle out of a parked position, or starting the vehicle. These features can be mechanical actuators or circuit-operated digital features that are designed to prevent or at least deter tampering and theft of a vehicle.

SUMMARY OF THE INVENTION

According to one aspect of the present invention, a tamper-resistant actuator includes a valid input, configured to deliver an input electrical current through a circuit. A high-pass filter is positioned within the circuit that degrades components of the input electrical current that are outside of a predefined current range. Components that are within the predefined current range define an output current. A transistor activates a switch when the output current from the high-pass filter is received by the transistor.

According to another aspect of the present invention, a tamper-resistant actuator includes a valid input, configured to deliver an input electrical current through a circuit. A transistor is configured to receive an output current that places the transistor in an activation state. A high-pass filter is located between the valid input and the transistor. The high-pass filter degrades at least a portion of the input electrical current. Portions of the input electrical current indicative of a predefined current range define the output current. A resistor of the high-pass filter directs the output current to the transistor.

According to another aspect of the present invention, a tamper-resistant circuit for an actuator includes a valid input, configured to provide an input electrical current. A high-pass filter is positioned to receive the input electrical current. A capacitor of the high-pass filter degrades components of the input electrical current that are outside of a predefined current range. Components of the input electrical current that are within the predefined current range define an output current. A resistor of the high-pass filter directs the output electrical current. A transistor receives the output current. The transistor activates a switch when the output current from the high-pass filter is received by the transistor. The switch is coupled to an actuator assembly.

These and other aspects, objects, and features of the present invention will be understood and appreciated by those skilled in the art upon studying the following specification, claims, and appended drawings.

DETAILED DESCRIPTION OF THE PREFERRED EMBODIMENTS

Figure 1:
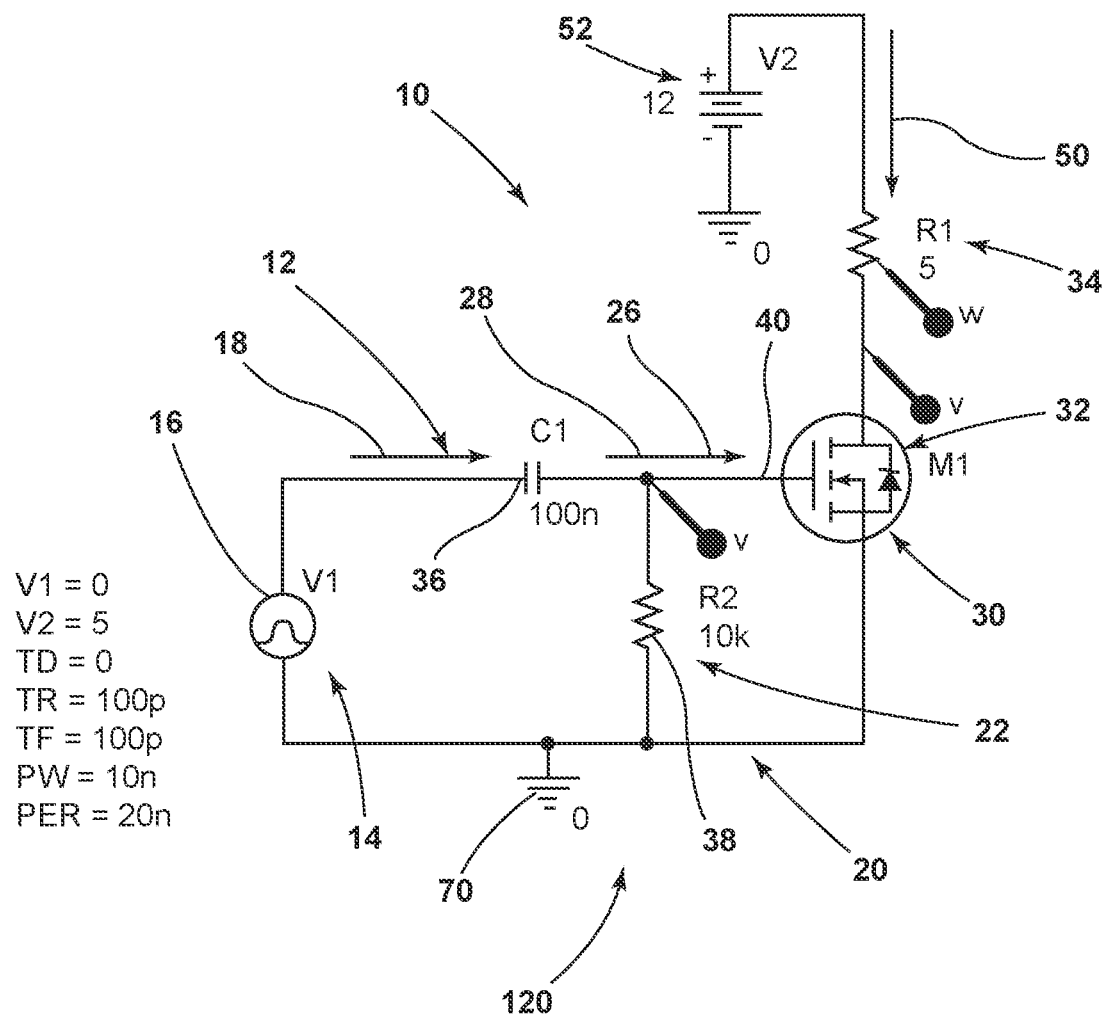
FIG. 1 is a schematic circuit diagram illustrating an aspect of the tamper-resistant actuator incorporated within a vehicle, and shown receiving an AC signal from the input.

For purposes of description herein, the terms "upper," "lower," "right," "left," "rear," "front," "vertical," "horizontal," and derivatives thereof shall relate to the invention as oriented in FIG. 1. However, it is to be understood that the invention may assume various alternative orientations, except where expressly specified to the contrary. It is also to be understood that the specific devices and processes illustrated in the attached drawings, and described in the following specification are simply exemplary embodiments of the inventive concepts defined in the appended claims. Hence specific dimensions and other physical characteristics relating to the embodiments disclosed herein are not to be considered as limiting, unless the claims expressly state otherwise.

As exemplified in FIGS. 1-6, reference numeral 10 generally refers to a tamper-resistant actuator that is incorporated within one or more portions of a vehicle for preventing unauthorized access or unauthorized tampering to various components of the vehicle. Utilizing the tamper-resistant actuator 10, tampering and theft can be deterred and at least partially prevented by requiring a specific AC signal 12 that can be filtered and verified by the tamper-resistant actuator 10. According to various aspects of the device, the tamper-resistant actuator 10 for the vehicle includes a valid input 14 that typically includes a power source 16 that is configured to deliver an input electrical current 18 through a circuit 20. A high-pass filter 22 is positioned within the circuit 20. The high-pass filter 22 is configured to degrade or eliminate certain non-conforming components 24 of the input electrical current 18 that are outside of a predetermined current range. This predetermined current range can be measured by a particular signal frequency, a particular signal amplitude, various voltages, and other similar signal components and characteristics. Conforming components 26 of the input electrical current 18 that are within the predefined current range, typically in the form of the specific AC signal 12, are unfiltered or substantially unfiltered by the high-pass filter 22 and are moved through the circuit 20 as an output current 28 to a transistor 32 or other similar switch 30. The transistor 32 is positioned within the tamper-resistant actuator 10, where the transistor 32 provides for the delivery of an actuating current 50 from an actuating power source 52 to a respective actuator 34 and activates the respective actuator 34. Using the high-pass filter 22, the respective actuator 34 can only be operated when the output current 28 from the high-pass filter 22 is received by the transistor 32. The output current 28 matches, or substantially matches, the specific AC signal 12, or conforming components 26 thereof. The high-pass filter 22 for the tamper-resistant actuator 10 includes a capacitor 36 and a resistor 38 that regulate the output current 28 to the switch 30, typically in the form of the transistor 32 or a portion of the transistor 32. The capacitor 36 and the resistor 38 are positioned in a series configuration so that the unfiltered output current 28 is directed along a path of lesser resistance 40 away from the resistor 38, and toward the switch 30. In certain aspects of the device, the high-pass filter 22 can also include a diode 66 to provide for passage of the output current 28 and/or the actuating current 50 in a desired direction, while also preventing flow of one or both of these currents in an opposing direction.

Referring again to FIGS. 1-4, the electrical-current filtering function of the high-pass filter 22 allows the output current 28 to be moved through the transistor 32, such as a MOSFET transistor. The transistor 32 activates upon receipt of the output current 28. Upon activation of the transistor 32, the transistor 32 allows the actuating current 50 to be delivered from the actuating power source 52 for operating the respective actuator 34. The respective actuator 34 can be in the form of any one of various actuating mechanisms within a vehicle that are attached to operational components within that vehicle. Such actuating mechanisms can be included within a shift-by-wire mechanism for a transmission, a park-lock mechanism for a transmission, an ignition starter, a lock for a door or any other similar respective actuator 34 that is incorporated within an aspect of a vehicle to be used to prevent tampering and/or theft of the vehicle.

Referring again to FIGS. 1-4, the high-pass filter 22 of the tamper-resistant actuator 10 is configured to filter out non-conforming components 24 of the input electrical current 18, such as components made up of a DC current 60, as well as components made up of an AC signal 12 that are outside of the predefined current range. As the input electrical current 18 reaches the capacitor 36 of the high-pass filter 22, the capacitor 36 degrades, rejects, or otherwise eliminates the non-conforming components 24 and prevents these non-conforming components 24 from reaching or having an appreciable impact on the switch 30 for the tamper-resistant actuator 10. Accordingly, as exemplified in FIGS. 3 and 4, where a DC current 60 is applied to the circuit 20 for the tamper-resistant actuator 10, the capacitor 36 significantly or completely degrades this DC current 60, as a non-conforming component 24, so that no appreciable output current 28 is provided to the switch 30 or any other downstream component of the circuit 20. The resulting effect is that the DC current 60 is not permitted to operate the respective actuator 34. In turn, the mechanism associated with the respective actuator 34 is not activated. It should be understood that the electrical readings and values incorporated within FIGS. 1-4 are exemplary in nature. The actual readings and values can differ depending on the design of the high-pass filter 22.

Figure 2:
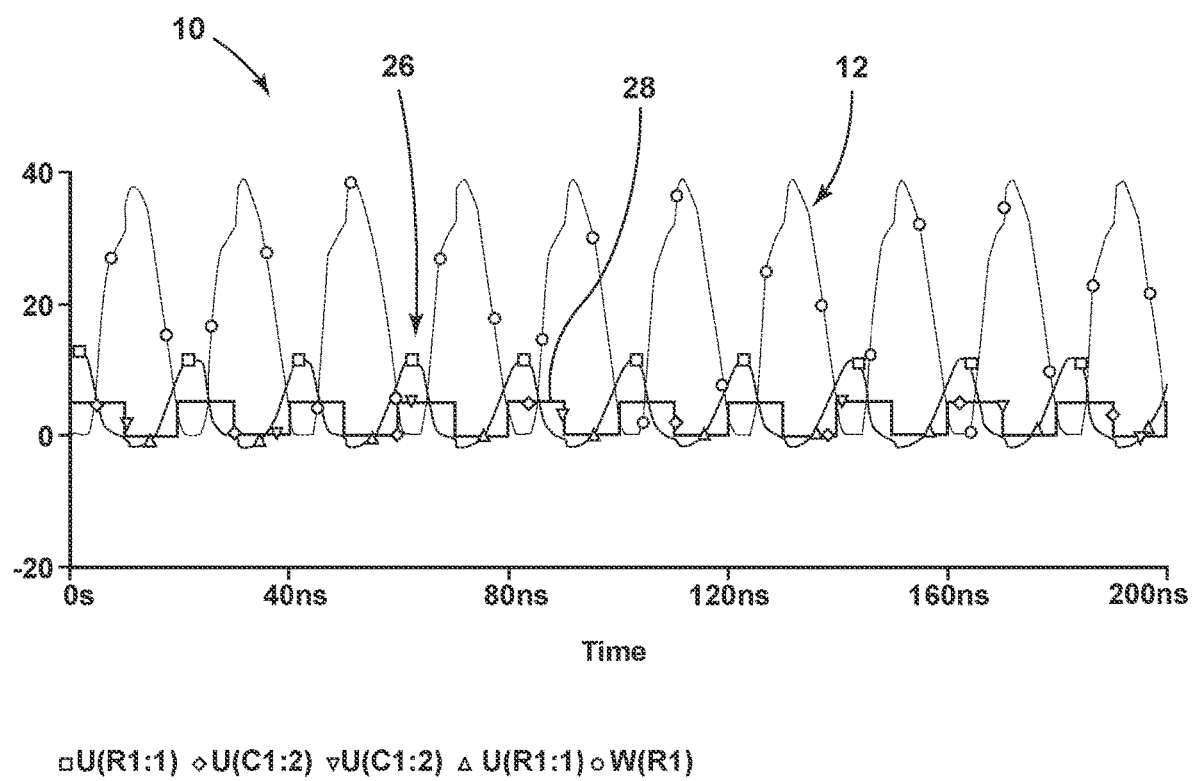
FIG. 2 is an exemplary electrical current simulation of an aspect of the tamper-resistant actuator receiving an AC signal.
Figure 3:
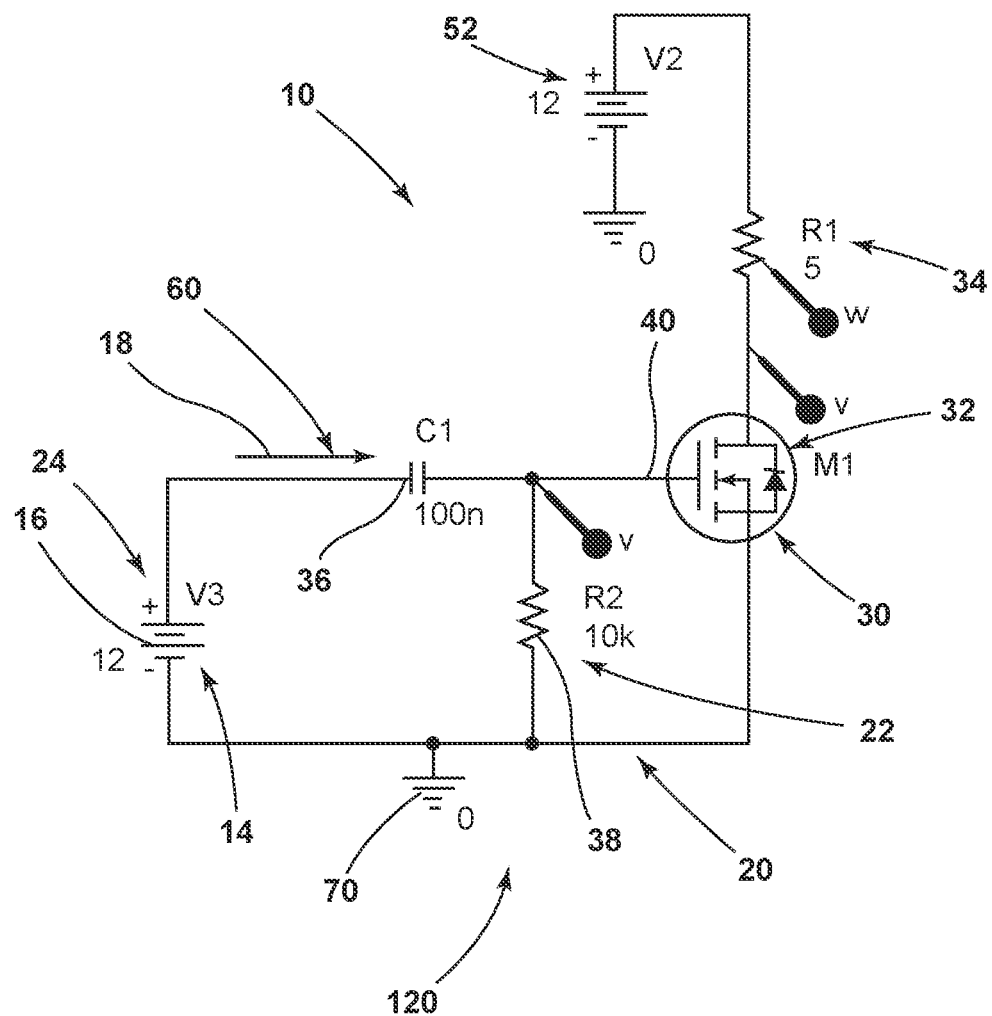
FIG. 3 is a schematic circuit diagram illustrating the tamper-resistant actuator of FIG. 1 and shown receiving a DC current from the input.
Figure 4:
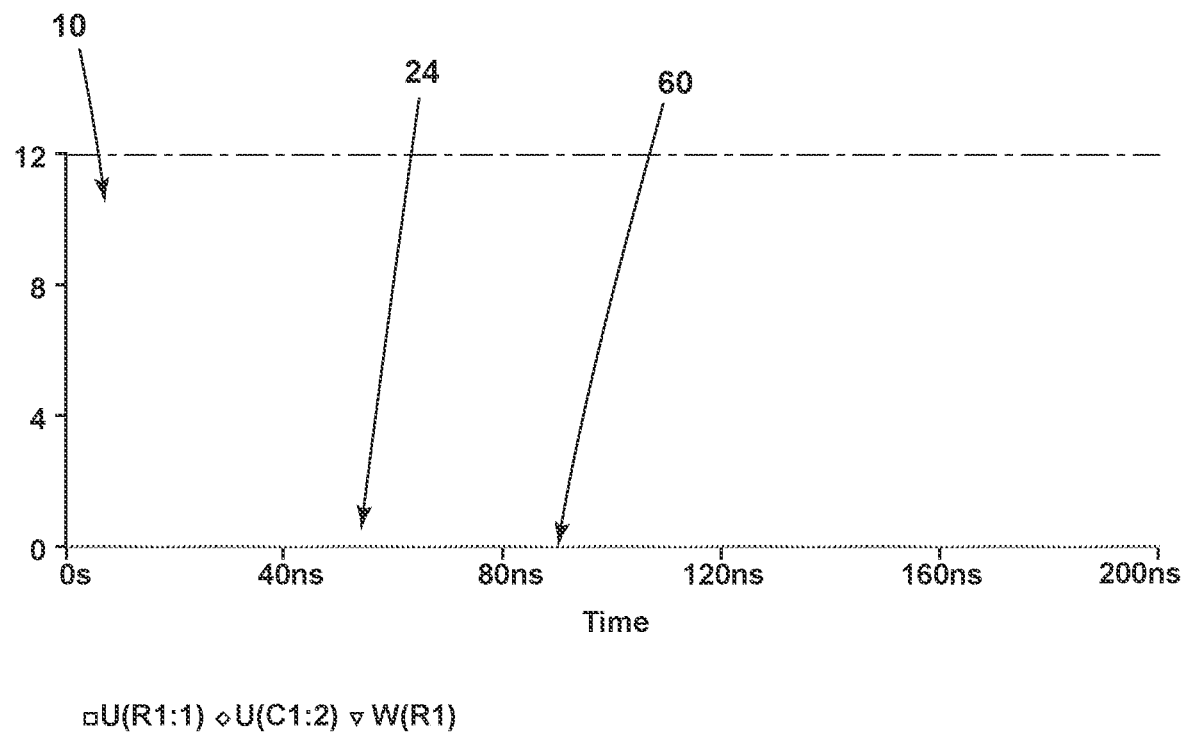
FIG. 4 is an exemplary electrical current simulation showing operation of an aspect of the tamper-resistant actuator when receiving a DC current.

Conversely, as exemplified in FIGS. 1 and 2, the input electrical current 18 can include the specific AC signal 12 that is a conforming component 26, or includes a conforming component 26. The conforming components 26 of the AC signal 12, which are within the predefined current range, are permitted to pass through the capacitor 36 for the high-pass filter 22. The resistor 38 for the high-pass filter 22 provides the path of lesser resistance 40 in the direction of the transistor 32. Accordingly, the resistor 38 prevents the AC conforming component 26 of the input electrical current 18, also referred to as the output current 28, from proceeding to a ground connection 70. Rather, the output current 28 is directed toward the transistor 32. Upon activation of the transistor 32, the output current 28 activates the transistor 32. The transistor 32, in turn, provides for the delivery of the actuating current 50 from the actuating power source 52 that is needed for operating the respective actuator 34 for the mechanical or electrical component of the vehicle. Only using the appropriate AC signal 12 having the conforming component 26 of the input electrical current 18 will allow for activation and operation of the respective transistor 32, actuator 34 and the related component of the vehicle.

Referring again to FIGS. 1 and 3, the high-pass filter 22 includes the capacitor 36 and resistor 38 that are placed in series configuration within the circuit 20 for the tamper-resistant actuator 10. The circuit 20 also includes the transistor 32 that is positioned between the capacitor 36 and the actuator 34. Utilizing the high-pass filter 22, the predefined current range for the input electrical current 18 can produce the output current 28 that includes an AC signal 12 that is or includes a conforming component 26. This conforming component 26 or components 26 have specific characteristics, such as frequency, amplitude and other characteristics, for limiting or preventing degradation as the input electrical current 18 moves through the capacitor 36.

Referring again to FIGS. 1-4, in an exemplary aspect of the device the predefined current range can be in the form of an AC signal 12 having a voltage that is within a predetermined voltage range or has a voltage that is above a predetermined minimum voltage. Additionally, in certain aspects of the device, the high-pass filter 22, in filtering the input electrical current 18, can allow the output current 28 of a frequency higher than a certain cutoff frequency, to pass the capacitor 36 and move towards the transistor 32. Alternatively, electrical currents, such as a DC current 60, that have a frequency lower than the cutoff frequency are degraded, rejected or substantially eliminated. These non-conforming components 24 and degraded electrical currents are rejected or blocked by the capacitor 36 and are not passed to the transistor 32. Accordingly the high-pass filter 22 can filter non-conforming components 24 of the input electrical current 18 to allow only those conforming components 26 having a voltage, frequency and/or amplitude that is within the predefined current range to be passed through the circuit 20 for operating the respective actuator 34. As discussed above, components that are outside of this predefined current range are degraded, rejected and substantially eliminated such that no operation of the respective actuator 34 occurs.

Utilizing this tamper-resistant actuator 10, an individual attempting to tamper with a particular vehicle may attempt to utilize an external power source 16 to operate the respective actuator 34 associated with the tamper-resistant actuator 10. Such tampering has been known to be accomplished through the use of a battery or other similar external DC electrical source 16. Using the high-pass filter 22, this DC current 60 can be filtered, degraded or rejected, and prevented from operating the respective actuator 34. Only using an AC signal 12 that is a conforming component 26 within the predefined current range can be used to move through the high-pass filter 22 for operating the respective actuator 34. Such an AC signal 12 is configured to be provided only by components of the vehicle itself and not from outside sources external to the vehicle. Typically, AC signals 12 and other similar currents that are within the predefined current range are more difficult to reproduce. The self-commutating actuator provided with the tamper-resistant actuator 10 includes the switch 30, typically the transistor 32, and high-pass filter 22 that allows operation of the respective actuator 34 or rotation of a motor 84 in a particular direction only with the specific AC signal 12 that is within the predefined current range. As discussed above, the high-pass filter 22 degrades or otherwise rejects DC currents 60 and DC voltages that would otherwise operate the switch 30, if not for the presence of the high-pass filter 22.

Referring again to FIGS. 1-4, utilizing the high-pass filter 22, the actuator 34 is operated to an actuating position only when the output current 28 is provided. As discussed above, the output current 28 is defined by an AC signal 12 that has a conforming component 26 that is within the predefined current range. Again, this predefined current range is set by the configuration of the capacitor 36 that allows certain frequencies or amplitudes of electrical current to pass therethrough for proceeding to the transistor 32. The high-pass filter 22 incorporated within the tamper-resistant actuator 10 prevents manipulation of the transistor 32 utilizing lower frequency currents, such as DC currents 60 and low-frequency AC signals 12, that may be utilized by unauthorized users of the vehicle.

The tamper-resistant actuator 10 that incorporates the transistor 32 and high-pass filter 22 provides a compact mechanism for preventing a vehicle's externally available terminals from being powered. Such terminals may be associated with a motor 84, door locks, a transmission, a shift-by-wire mechanism, a park lock, or other similar externally accessible actuator.

Figure 5:
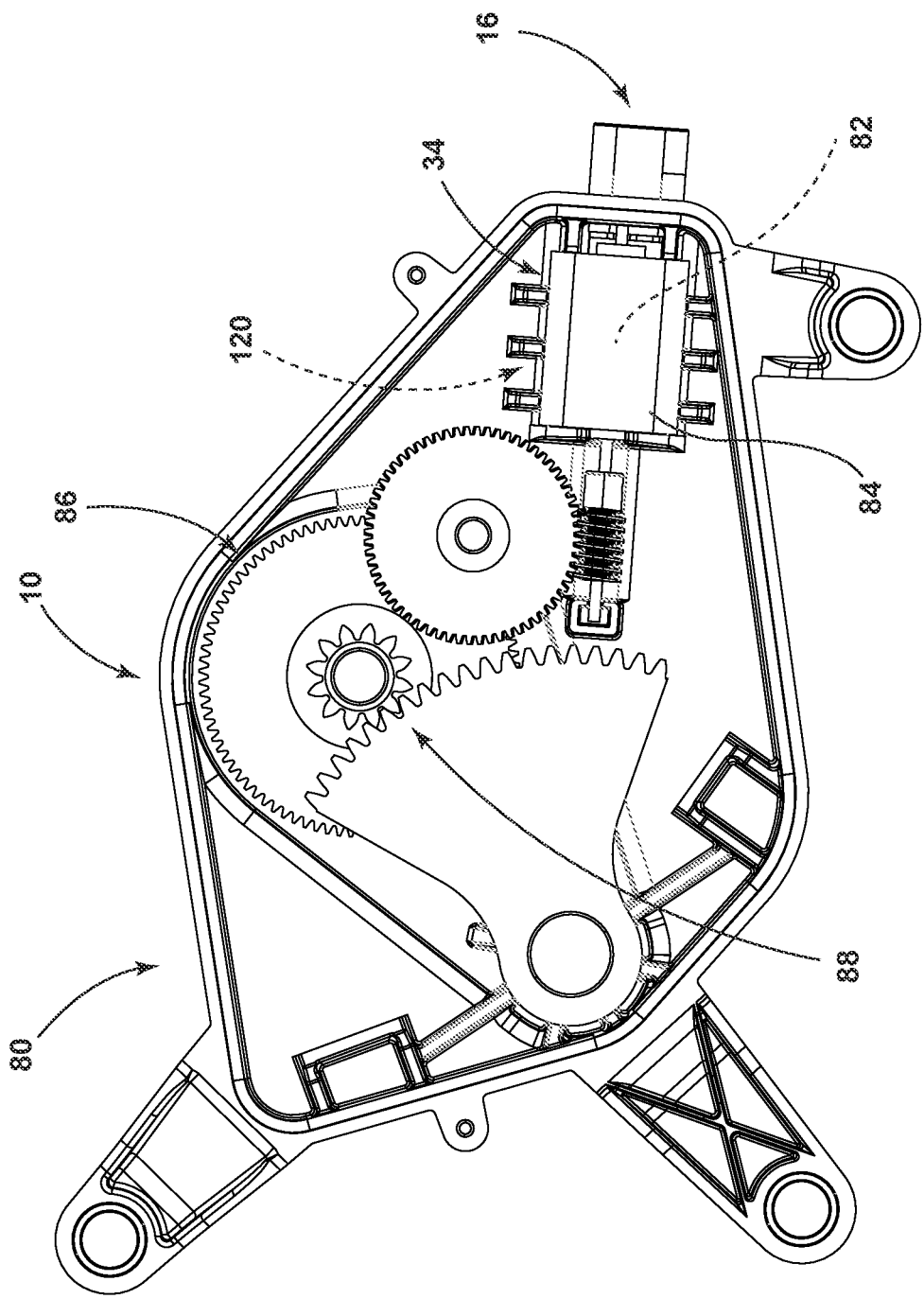
FIG. 5 is a cross-sectional view of an exemplary operating mechanism incorporating an aspect of the tamper-resistant actuator.
Figure 6:
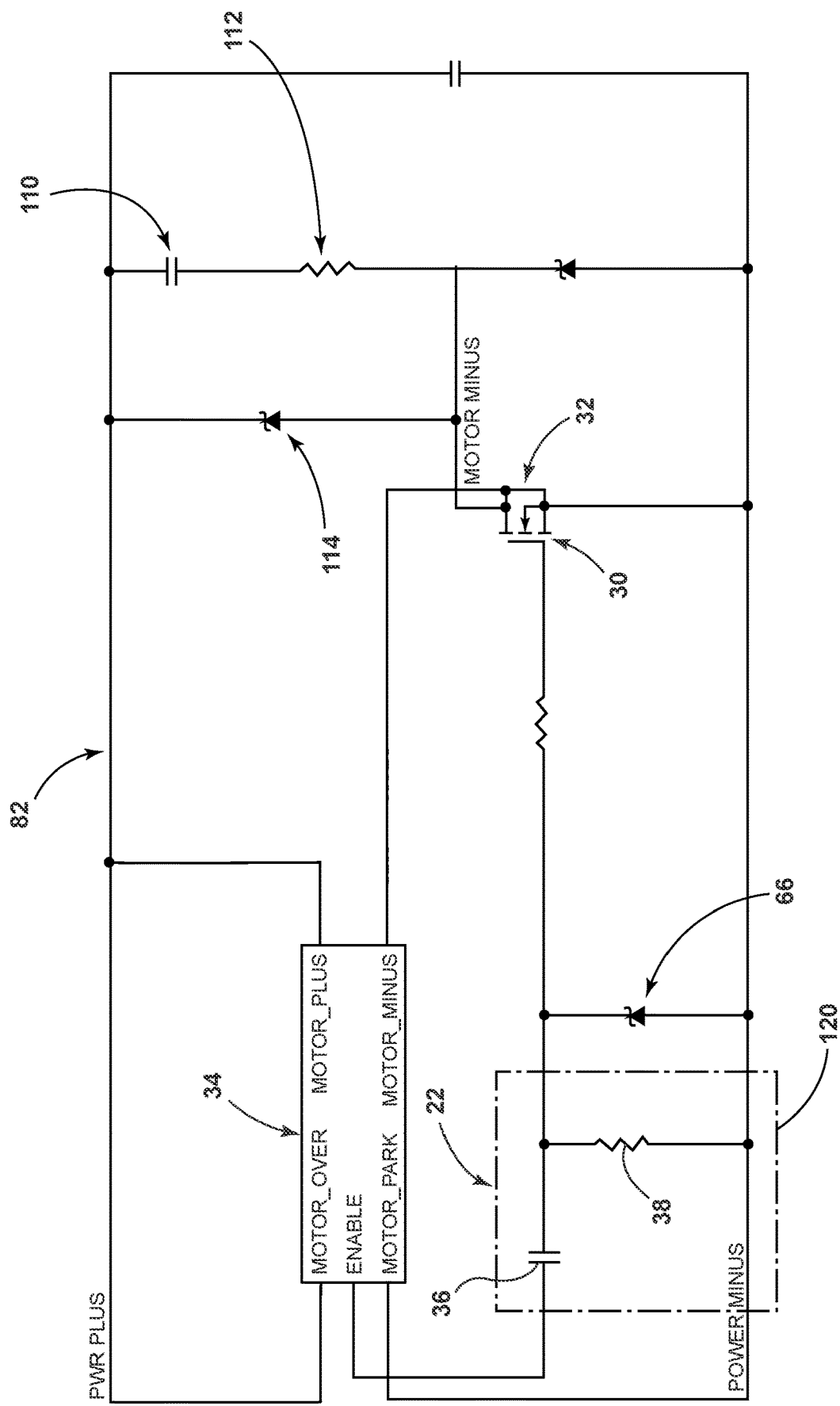
FIG. 6 is a schematic and exemplary circuit diagram for an actuating assembly that incorporates an aspect of the tamper-resistant actuator.

Referring now to FIGS. 5 and 6, an exemplary operating mechanism 80 and circuit 20 are illustrated and incorporate an aspect of the tamper-resistant actuator 10. The tamper-resistant actuator 10 is typically incorporated within a printed circuit board (PCB) 82 for the operating mechanism 80. The device exemplified in FIG. 6 includes a motor 84 that is activated only when the output current 28 from the high-pass filter 22 is received by the transistor 32 for activating the switch 30 that activates and deactivates the motor 84. Activation of the motor 84 serves to operate various gearing mechanisms 86 that, in turn, operate a mechanical interface 88 for any one of various devices. As discussed above, these devices can include, but are not limited to, locking mechanisms, shut-out mechanisms, and other similar mechanisms that can be used to prevent access or use of vehicles, and other electrical and mechanical fixtures and devices. The exemplary circuit 20 illustrated in FIG. 6 includes the high-pass filter 22 for the tamper-resistant actuator 10 that receives the input electrical current 18. As discussed above, the high-pass filter 22, typically located between the valid input 14 and the transistor 32, degrades at least a portion of the input electrical current 18. Portions of the input electrical current 18 that are indicative of the pre-defined current range pass through the high-pass filter 22 to define the output current 28 that is delivered to the transistor 32. The transistor 32 receives the output current 28 to place the transistor 32 in an activation state. This activation state allows for the transistor 32 to operate a switch 30 that is typically positioned between the high-pass filter 22 and the transistor 32. Once the switch 30 is activated, an actuating current 50 is delivered to the actuating assembly. In the case of the exemplary circuit 20 illustrated in FIG. 6, the actuating assembly is a motor 84 for the operating mechanism 80 exemplified in FIG. 5. In the various aspects of the device, the valid input 14 can be in the form of some user input provided by an authorized user to initiate the input electrical current 18 through the circuit 20. The valid input 14 can also be in the form of an input that is provided by a system of mechanism of the vehicle that initiates the input electrical current 18 through the circuit 20. The system or mechanism of the vehicle that provides one or more of the valid inputs 14 can operate automatically or at the direction of some user interaction, or a combination thereof.

Referring again to FIG. 6, the tamper-resistant actuator 10 can include various supplemental capacitors 110 and supplemental resistors 112, separate from the high-pass filter 22, that are included in the circuit 20 to provide for electromagnetic compatibility (EMC). In addition, a transient voltage suppression (TVS) diode 114 can be incorporated to provide for spikes in electrical current that may move through the circuit 20 having the tamper-resistant actuator 10. In certain aspects of the device, the high-pass filter 22 can include a diode 66 that is positioned within a series relationship with the capacitor 36 and resistor 38 of the high-pass filter 22. This diode 66 can operate to allow electrical current, such as the output current 28, to pass in one direction through the diode 66 for activating the actuator assembly.

Referring again to FIGS. 1-6, the tamper-resistant actuator 10 can include a tamper-resistant circuit 120 for operating the respective actuator 34. The tamper-resistant circuit 120 can include the valid input 14 that is configured to provide the input electrical current 18. The high-pass filter 22 is positioned to receive the input electrical current 18. A capacitor 36 of the high-pass filter 22 operates to degrade non-conforming components 24 of the input electrical current 18 that are outside of a predetermined current range. Conforming components 26 of the input electrical current 18 that are within the predefined current range pass through the capacitor 36 of the high-pass filter 22 and define the output current 28. The resistor 38 of the high-pass filter 22 directs the output electrical current along the path of lesser resistance 40, typically in the direction of a transistor 32. The transistor 32 receives the output current 28 and activates the switch 30. This switch 30 is typically activated when the output current 28 from the high-pass filter 22 is received by the transistor 32. The switch 30 is in electrical communication with an actuator assembly, such as a motor 84.

Utilizing conventional anti-theft techniques, unauthorized users of vehicles have been known to unplug certain actuators and power those actuators through the use of a battery or other external power source 16 that provides a DC current 60. Utilizing the tamper-resistant actuator 10 described above, such DC currents 60 would be rejected by the high-pass filter 22 and prevented from reaching the switch 30 and other components of the tamper-resistant actuator 10.

Utilizing the tamper-resistant actuator 10, a circuit-operated solution for preventing tampering and theft of vehicles is achieved. This tamper-resistant actuator 10 also provides a low-cost solution that can be incorporated in numerous components of the vehicle. These components can cooperate in combination to provide multiple levels of tamper-resistance and theft prevention for a vehicle.

According to various aspects of the device, the tamper-resistant actuator 10 described herein can be used within various vehicles as well as non-vehicle applications. Such applications can include, but are not limited to, personal vehicles, fleet vehicles, transport vehicles, mass-transit vehicles, aircraft, watercraft, security devices for residential, commercial and industrial structures, electrical equipment, computers and other similar electrically-operated devices that also have mechanical operating systems.

It is to be understood that variations and modifications can be made on the aforementioned structure without departing from the concepts of the present invention, and further it is to be understood that such concepts are intended to be covered by the following claims unless these claims by their language expressly state otherwise.

What is claimed is:

1. A tamper-resistant actuator comprising:
   a valid input, configured to deliver an input electrical current through a circuit;
   a high-pass filter positioned within the circuit that degrades components of the input electrical current that are outside of a predefined current range, wherein components that are within the predefined current range define an output current; and
   a transistor switch that activates an actuator assembly when the output current from the high-pass filter is received by the transistor switch, wherein the predefined current range is partially defined as being an AC signal.

2. The tamper-resistant actuator of claim 1, wherein the high-pass filter includes a capacitor and a resistor that regulate the output current to the transistor switch.

3. The tamper-resistant actuator of claim 1, wherein the high-pass filter is incorporated within the actuator assembly for a vehicle.

4. The tamper-resistant actuator of claim 2, wherein the high-pass filter includes the capacitor and the resistor placed in a series configuration.

5. The tamper-resistant actuator of claim 1, wherein the predefined current range is a specific frequency of the AC signal.

6. The tamper-resistant actuator of claim 5, wherein the transistor switch is operated to an actuating position only when the output current is the AC signal that is within the predefined current range.

7. The tamper-resistant actuator of claim 1, wherein the transistor switch is a MOSFET transistor.

8. The tamper-resistant actuator of claim 1, wherein the predefined current range is a specific frequency of the AC signal.

9. The tamper-resistant actuator of claim 1, wherein the predefined current range is the AC signal having a voltage that is within one of a predetermined current range and a predetermined minimum voltage.

10. The tamper-resistant actuator of claim 1, wherein the actuator assembly is a motor.

11. A tamper-resistant actuator comprising:
    a valid input, configured to deliver an input electrical current through a circuit;
    a transistor switch that is configured to receive an output current that places the transistor switch in an activation state;
    a high-pass filter located between the valid input and the transistor switch, wherein the high-pass filter degrades at least a portion of the input electrical current, and wherein portions of the input electrical current indicative of a predefined current range define the output current; and
    a resistor of the high-pass filter that directs the output current to the transistor switch, wherein the transistor switch in the activation state delivers an actuating current to an actuator assembly, and wherein the predefined current range is partially defined as being an AC signal.

12. The tamper-resistant actuator of claim 11, wherein the high-pass filter includes a capacitor and the resistor that are placed in a series configuration and that regulate the output current to the transistor switch.

13. The tamper-resistant actuator of claim 11, wherein the transistor switch is operated to an actuating position only when the output current is the AC signal that is within the predefined current range.

14. The tamper-resistant actuator of claim 11, wherein the actuator assembly is part of a locking mechanism of a vehicle.

15. The tamper-resistant actuator of claim 12, wherein the capacitor of the high-pass filter degrades at least a component of the input electrical current.

16. The tamper-resistant actuator of claim 11, wherein the actuator assembly is a motor.

17. A tamper-resistant circuit for an actuator, the tamper-resistant circuit comprising:
    a valid input, configured to provide an input electrical current;
    a high-pass filter positioned to receive the input electrical current, wherein a capacitor of the high-pass filter degrades components of the input electrical current that are outside of a predefined current range, wherein components of the input electrical current that are within the predefined current range define an output current;
    a resistor of the high-pass filter that directs the output current;
    a transistor switch that receives the output current;
    an actuator assembly, wherein the transistor switch activates the actuator assembly when the output current from the high-pass filter is received by the transistor switch, wherein the predefined current range is partially defined as being an AC signal.

18. The tamper-resistant circuit of claim 17, wherein the capacitor and the resistor are placed in a series configuration and regulate the output current to the transistor switch.

19. The tamper-resistant circuit of claim 17, wherein the capacitor of the high-pass filter performs degradation of the components of the input electrical current, and wherein the predefined current range is the AC signal having a voltage that has at least a predetermined minimum voltage.

20. The tamper-resistant circuit of claim 17, wherein the actuator assembly is a motor.

* * * * *